US012694921B2

(12) United States Patent
Prasad et al.

(10) Patent No.: US 12,694,921 B2
(45) Date of Patent: Jul. 28, 2026

(54) DYNAMIC MEMORY OPERATIONS

(71) Applicant: Advanced Micro Devices, Inc., Santa Clara, CA (US)

(72) Inventors: Divya Madapusi Srinivas Prasad, Santa Clara, CA (US); Michael Ignatowski, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 41 days.

(21) Appl. No.: 18/333,135

(22) Filed: Jun. 12, 2023

(65) Prior Publication Data

US 2024/0087636 A1 Mar. 14, 2024

Related U.S. Application Data

(60) Provisional application No. 63/404,792, filed on Sep. 8, 2022, provisional application No. 63/404,796, filed on Sep. 8, 2022.

(51) Int. Cl.
G11C 11/406 (2006.01)

(52) U.S. Cl.
CPC .. G11C 11/40626 (2013.01); G11C 11/40615 (2013.01); G11C 11/40622 (2013.01)

(58) Field of Classification Search
CPC ........ G11C 11/40626; G11C 11/40615; G11C 11/40622; G11C 11/4074; G11C 5/04; G11C 11/40611

(Continued)

(56) References Cited

U.S. PATENT DOCUMENTS

2009/0132876 A1 5/2009 Freking et al.
2010/0194718 A1 8/2010 Morita
(Continued)

FOREIGN PATENT DOCUMENTS

CN 120345025 A 7/2025
EP 2386084 A2 11/2011
(Continued)

OTHER PUBLICATIONS

PCT/US2023/072694 , "International Seach Report and Written Opinion", PCT Application No. PCT/US2023/072694, Mar. 22, 2024, 9 pages.

(Continued)

*Primary Examiner* — Fernando Hidalgo
(74) *Attorney, Agent, or Firm* — FIG. 1 Patents

(57) ABSTRACT

Dynamic memory operations are described. In accordance with the described techniques, a system includes a stacked memory and one or more memory monitors configured to monitor conditions of the stacked memory. A system manager is configured to receive the monitored conditions of the stacked memory from the one or more memory monitors, and dynamically adjust operation of the stacked memory based on the monitored conditions. In one or more implementations, a system includes a memory and at least one register configured to store a ranking for each of a plurality of portions of the memory. Each respective ranking is determined based on an associated retention time of the respective portion of the memory. A memory controller is configured to dynamically refresh the portions of the memory at different times based on the ranking for each of the plurality of portions of the memory stored in the at least one register.

20 Claims, 10 Drawing Sheets

(58) Field of Classification Search
USPC ........................................................ 365/222
See application file for complete search history.

(56) References Cited

U.S. PATENT DOCUMENTS

| | | | |
|---|---|---|---|
| 2010/0275037 A1 | 10/2010 | Lee et al. | |
| 2011/0093764 A1 | 4/2011 | Tsukada et al. | |
| 2014/0029367 A1 | 1/2014 | Jung | |
| 2014/0136754 A1 | 5/2014 | Hyde et al. | |
| 2015/0009737 A1 | 1/2015 | Stephens, Jr. | |
| 2018/0052615 A1* | 2/2018 | Russell | G06F 3/0619 |
| 2018/0287634 A1 | 10/2018 | Rom et al. | |
| 2020/0159905 A1 | 5/2020 | Kim et al. | |
| 2020/0371871 A1 | 11/2020 | Li | |
| 2021/0074348 A1* | 3/2021 | Prather | G11C 11/40618 |
| 2022/0197745 A1 | 6/2022 | Schaefer et al. | |
| 2022/0199142 A1* | 6/2022 | Mathiyalagan | G11C 29/022 |
| 2024/0087667 A1 | 3/2024 | Prasad et al. | |

FOREIGN PATENT DOCUMENTS

| | | | | |
|---|---|---|---|---|
| EP | 4584786 | 7/2025 | | |
| KR | 10-1894132 | 8/2018 | | |
| TW | 202137200 A | * 10/2021 | ........... | G06F 1/1658 |
| TW | 1755970 B | * 2/2022 | | |
| WO | WO-2014025676 A1 | * 2/2014 | .......... | G06F 11/1004 |
| WO | WO-2021189887 A1 | * 9/2021 | .......... | G11C 11/401 |

OTHER PUBLICATIONS

Prasad, Divya Madapusi Srinivas, et al., "US Provisional Application as Filed", U.S. Appl. No. 63/404,828, filed Sep. 8, 2022, 34 pages.

Prasad, Divya Madapusi Srinivas, et al., "US Provisional Application as Filed", U.S. Appl. No. 63/404,792, filed Sep. 8, 2022, 38 pages.

Prasad, Divya Madapusi Srinivas, et al., "US Provisional Application as Filed", U.S. Appl. No. 63/404,796, filed Sep. 8, 2022, 41 pages.

"Non-Final Office Action", U.S. Appl. No. 18/458,052, Nov. 19, 2024, 18 pages.

PCT/US2023/073216 , "International Seach Report and Written Opinion", PCT Application No. PCT/US2023/073216, Dec. 21, 2023, 8 pages.

Prasad, Divya Madapusi Srinivas, et al., "Pursuant to MPEP § 2001.06(b) the applicant brings the following co-pending application to the Examiner's attention:", U.S. Appl. No. 18/458,052, filed Aug. 29, 2023, 42 pages.

"Final Office Action", U.S. Appl. No. 18/458,052, Jul. 23, 2025, 24 pages.

Non-Final Office Action issued in U.S. Appl. No. 18/458,052, mailed Feb. 12, 2026, 21 pages.

\* cited by examiner

500

WWL: Write word line
WBL: Write bit line
RWL: Read word line
RBL: Read bit line
SN: Storage node, configured with trench
capacitor in one or more implementations,
e.g., to mimic off-chip DRAM retention time

700

Controller 704

Memory 706

708

708

Processor
Chip(s) 702

710

800

802
Monitor, by one or more memory monitors, conditions
of a stacked memory

804
Communicate, by the one or more memory monitors, the monitored conditions of
the stacked memory to a memory manager 806
Adjust, by the memory manager, operation of the stacked memory based on the
monitored conditions

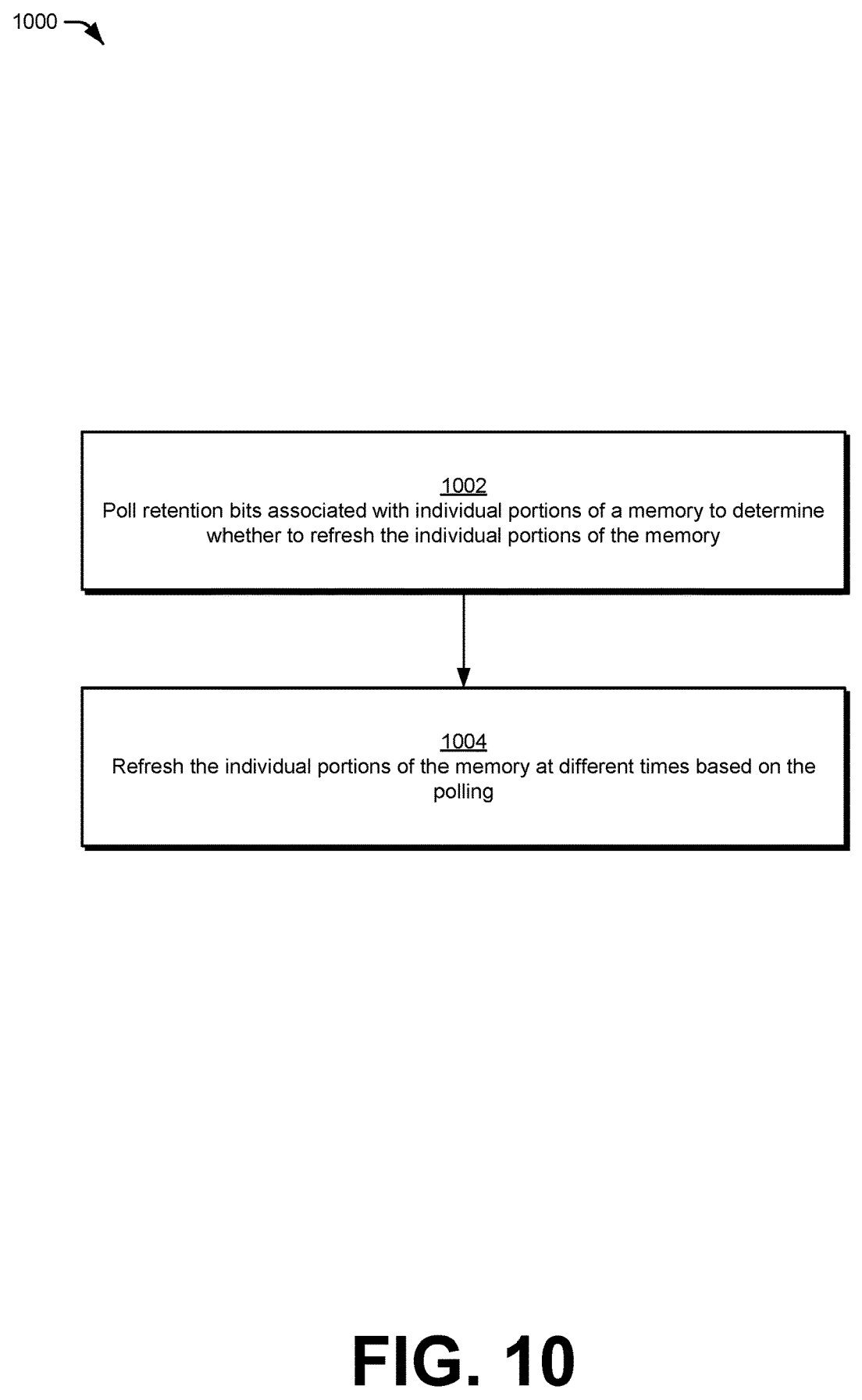

1000 ⟍

```
┌─────────────────────────────────────────────────────────────┐
│                           1002                               │
│ Poll retention bits associated with individual portions of a │
│ memory to determine whether to refresh the individual        │
│ portions of the memory                                       │
└─────────────────────────────────────────────────────────────┘
                              │
                              ▼
┌─────────────────────────────────────────────────────────────┐
│                           1004                               │
│ Refresh the individual portions of the memory at different   │
│ times based on the polling                                   │
└─────────────────────────────────────────────────────────────┘
```

FIG. 10

DYNAMIC MEMORY OPERATIONS

RELATED APPLICATION

This application claims priority under 35 U.S.C. § 119(e) to U.S. Provisional Patent Application No. 63/404,792, filed Sep. 8, 2022, titled "Memory Refresh Schemes," and to U.S. Provisional Patent Application No. 63/404,796, filed Sep. 8, 2022, titled "Logic Die Computation with Memory Technology Awareness." These disclosures are incorporated by reference herein in their entireties.

BACKGROUND

Memory, such as random-access memory (RAM), stores data that is used by the processor of a computing device. Due to advancements in memory technology, various types of memories, including various non-volatile and volatile memories, are being deployed for numerous applications. Examples of such non-volatile memories include, for instance, Ferro-electric memory and Magneto-resistive RAM, and examples of such volatile memories include dynamic random-access memory (DRAM), including high bandwidth memory and other stacked variants of DRAM. However, conventional configurations of these memories have limitations, which can restrict their use in connection with some deployments. For example, compute dies are largely unaware of static and dynamic properties of memory dies. This can lead to non-optimal system performance and power usage.

BRIEF DESCRIPTION OF THE DRAWINGS

FIG. 10 depicts a procedure in an additional example implementation of dynamic memory operations.

DETAILED DESCRIPTION

Overview

Figure 1:
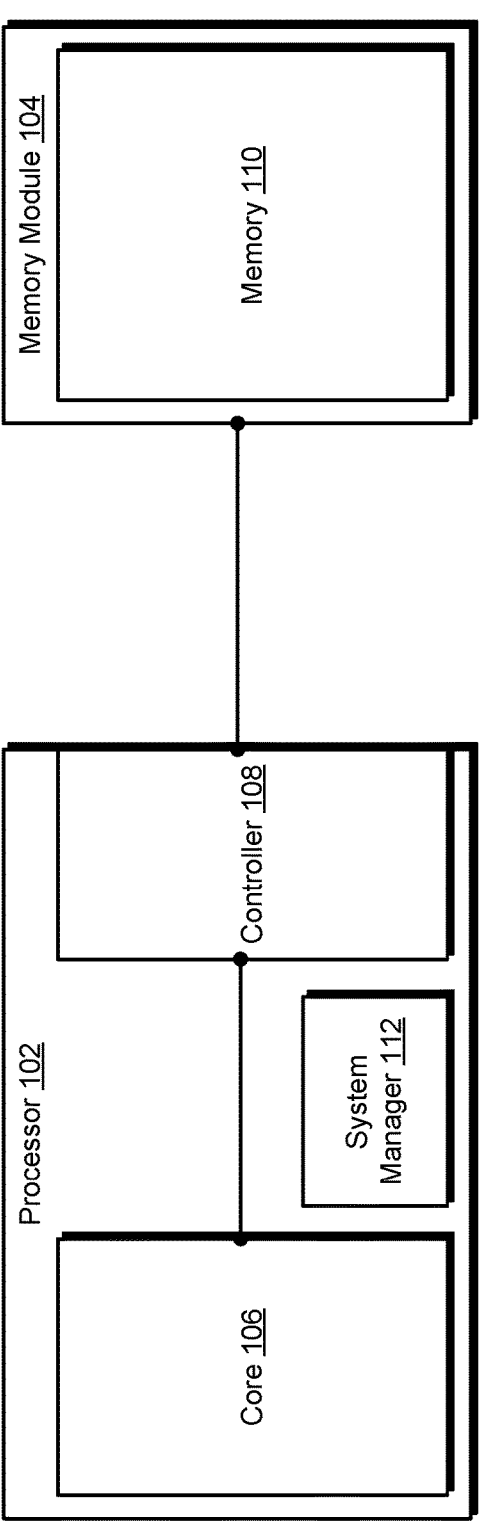
FIG. 1 is a block diagram of a non-limiting example system having a memory and a controller operable to implement dynamic memory operations.

The memory wall has been referred to as one of the key limiters in pushing the bounds of computation in modern systems. High bandwidth memory (HBM) and other stacked dynamic random access memory (DRAM) memories are increasingly utilized to alleviate off-chip memory access latency as well as to increase memory density. Despite these advances, conventional systems treat multi-tiered memories as stacked "2D" memory macros. Doing so results in fundamental limitations in how much bandwidth and speed stacked "3D" memories can achieve.

To overcome these problems, dynamic memory operations, including memory refresh schemes and logic die computation with memory technology and array awareness, are described. In one or more implementations involving memory refresh schemes, the described techniques treat stacked memory as a true three-dimensional (3D) memory by utilizing improved refresh mechanisms and components that take advantage of the increased yield and variation due to the multiple memory dies of stacked memories. Thus, rather than using a static refresh for an entire memory, the described techniques dynamically refresh individual portions of the memory (e.g., individual dies and/or individual rows or banks of a die) at different times. Doing so reduces the refresh overhead that occurs in conventional off-chip memory systems which enables greater performance, e.g., throughput and/or power usage of memory.

In conventional approaches, stacked memories (e.g., DRAM) are statically refreshed at a "static" or "fixed" rate, e.g., per the Joint Electron Device Engineering (JEDEC) specification. Due to this, conventional approaches refresh all memories at a refresh rate which corresponds to a "worst case" or "pessimistic case" refresh time, such as around 64 milliseconds, which can be reduced by refreshing on a per-memory bank basis. However, this can limit instructions per cycle (IPC) and system performance and, due to "unnecessary" refreshes, the power overhead associated with such static refresh is higher than for the described memory refresh schemes.

However, by stacking multiple DRAM dies (e.g., the multiple tiers of a stacked memory), the described techniques take advantage of variations in retention time between the stacked dies, such as by taking advantage in a variation between a first retention time of a first tier of the memory and a second retention time of a second tier of the memory.

In one example of dynamic memory operations in which memory refresh schemes are used, for instance, the memory is characterized to associate respective retention times with different portions of the memory. Further, the portions of the memory are ranked based on the associated retention times. In variations, this ranking is then stored to provide knowledge of the variable retention times of the memory. This knowledge of the variable retention times of the memory is thus accessible not only to a controller to perform dynamic refresh and to allocate memory, but also the logic dies, to take advantage of memory technology properties (e.g., both resulting from manufacturing variations and dynamic conditions such as different workloads that cause differential heating and/or voltage droop across the die). The portions of the memory are then dynamically refreshed at different times based on the ranking and, in one or more variations, based on optimal operating conditions associated with the logic die.

In another example of dynamic memory operations in which memory refresh schemes are used, the system leverages two or more retention bits in portions (e.g., each row) of the memory, which are configured to represent a weak logic 1 and a weak logic 0. In at least one variation, the retention bits are configured to "leak" faster than the rest of the data stored in the associated portion, and thus the retention bits act as an early canary which indicate to perform an early refresh of the particular portion of memory associated with the retention bits. In one or more implementations, the retention bits are "polled" at predetermined intervals of time, such as regular or irregular intervals (e.g., based on occurrence of an event). In some cases, the retention bits are polled at different times and/or rates for each die of the memory or for each row or word within a die of the memory. In some scenarios, such polling results in an overhead in power consumption and performance. This is because due to the polling memory banks may be unavailable for read/write and in some cases error correction code (ECC) checks are performed at each data read which is capable of causing a system performance reduction. Doing so, however, reduces the number of times each row of the memory must be refreshed because each row is dynamically refreshed only if the retention bits indicate a need to refresh. This contrasts with conventional approaches where each portion of the memory is refreshed at the worst or pessimistic rate. Notably also, this gives back performance while also increasing availability of the memory.

Generally, "off-chip" memories (e.g., DRAM) are implemented with a destructive read, such that using retention bits is not suitable for conventional systems which utilize off-chip memories. This is because polling such conventionally designed retention bits (e.g., based on a classical off-chip DRAM 1t-1C bitcell circuit) causes the retention bits to be read, and then written back. Doing so causes a fresh set of retention bits to be written each time the retention bits are polled, thereby destroying the history of the data in the associated portion of the memory. Thus, these conventional systems do not serve the purpose of the indicated need for a refresh.

To overcome these problems, in one or more implementations retention bits are configured to allow polling without destructive reads. To do so, in at least one variation, the retention bits are implemented as a bitcell that is different from DRAM, but mimics the DRAM bitcell to capture the retention time and stored value degradation, and is tunable to act as a canary for the actual degradation of the other bits containing useable data. In one or more implementations, the retention bits are configured as special multi-port cells (e.g., 2T gain-cell DRAM), where the stored data is destroyed on a read because the read port is separate from the write port. Notably, these special multi-port cells have a similar retention time as off-chip DRAM, or slightly worse to enable the retention bits to function as a canary. In one or more implementations, such bitcell(s) are implemented with separate read and write paths so that the stored charge is not destroyed on a read. In contrast to conventionally configured retention bits, the retention bits discussed herein are configured to be polled such that those retention bits are accessed separately from the actual bits of the memory portion so as not to trigger a read and write-back for all the bits in the respective portion of memory that takes place inherently as part of the DRAM read operation.

The described techniques also include logic die computation and memory technology and array awareness. In one or more implementations which involve logic die computation and memory technology and array awareness, one or more dies of memory are configured with monitors to provide feedback about the memory. For instance, the monitors are configured to monitor various conditions (e.g., manufacturing variability, aging, thermal, and/or other environmental conditions) of the memory or of portions of the memory (e.g., of one or more cells, rows, banks, die, etc.). These monitors provide feedback, such as feedback describing one or more of those conditions, to a logic die (e.g., a memory controller, ALU, CPU, GPU) which the logic die is configured to use for memory allocation, frequency throttling of the logic (or portions of the memory), voltage throttling of the logic (or portions of the memory), and so forth. Alternatively or additionally, in scenarios where the logic is overclocked and/or operating with increased voltage, in at least one variation, the system is configured to increase a refresh rate of the memory to compensate for reduced retention time of the bitcells due to overheating of the logic die, such as in connection with some applications configured for single-thread performance or a performance boost.

The described techniques thus further treat stacked memory as true 3D memory, in part, by utilizing such monitors to take advantage of the increased yield of stacked memories and the variation in conditions experienced at different portions of the memory, e.g., due to multiple memory dies of stacked memories and due to position of portions of memory relative to one another, relative to other system components, and relative to external sources. Thus, rather than using a static refresh in the memory die or using static overclocking parameters for the entire logic die, the described techniques dynamically refresh the memory and/or overclock individual portions of the logic die (e.g., individual dies and/or individual rows or banks of a die) at different times. Doing so enables portions of the memory and logic under more favorable conditions (e.g., thermal or manufacturing conditions) to be utilized more heavily by the system, as those conditions are detected in real-time and/or at a calibration phase, than portions under less favorable conditions. Relative to conventional architectures, where an adaptive system such as the adaptive/dynamic voltage frequency scaling circuit blocks (AVFS/DVFS) does not monitor stacked memory in-die, this enables greater performance of stacked memory and/or logic and also extends the life of the hardware (e.g., stacked memories).

In addition to refreshing stacked memories statically at a "worst case" or "pessimistic case" refresh time as noted above, in many conventional approaches, logic dies (e.g., memory controllers) are unaware of memory conditions (e.g., thermal conditions), and memory is unaware of conditions of logic dies. Some conventional HBM approaches incorporate thermal sensors within the memory dies to determine refresh issuance, e.g., 1× refresh versus 2× refresh in HBM systems. However, these approaches are intra-memory-based, and the memories do not inform (e.g., provide feedback to) logic dies about their conditions, and logic (e.g., central processing units (CPU), graphics processing units (GPU), accelerators, and so on) does not inform memory dies about its conditions. As a result, in various scenarios, conventional logic dies continue utilizing portions of a stacked memory under less favorable conditions rather than limiting memory-based operations to portions under more favorable conditions, and the logic is overly constrained due to pessimistic assumptions about the memory and thus, run at less favorable and/or less performant constraints.

Additionally, because conventional logic dies (e.g., an AVFS system within a CPU or a memory interface die) do not have information about the conditions under which different portions of memory operate (e.g., because they are not connected to monitors within portions of memory), conventional techniques overclock an entirety of the logic or refresh memory in a same way. Due to this, in various scenarios, conventional logic dies "overclock" the logic in a way that results in some portions of a stacked memory overheating or having reduced refresh or reduced performance (e.g., the portions under less favorable conditions) while throttling frequency of logic under other conditions that do not allow the logic die to run optimally. Since conventional approaches do not provide feedback about memory conditions to logic dies with which a stacked memory interfaces (or feedback about logic die conditions to the memory die), such conventional approaches are unable to achieve as high of performance (e.g., throughput) or power savings as the described techniques. In short, conventional approaches do not involve dynamic exchange of information about operating conditions (e.g., thermal conditions and voltage droop conditions) between memories and the logic dies with which those memories interface. Rather, conventional approaches independently optimize logic dies and memories, resulting in inefficiencies.

However, by configuring memory dies of stacked memory with monitor(s) to detect conditions of different portions of the memory, the described techniques take advantage of variations in conditions between the stacked dies, such as by throttling a voltage and/or frequency differently (e.g., for overclocking) for portions of the logic die based on different detected (e.g., thermal, manufacturing) and/or known (e.g., position relative to portions of the logic) conditions and/or by refreshing the portions of memory at different times based on the conditions that are optimal for the logic die.

In some aspects, the techniques described herein relate to a system including: a stacked memory, one or more memory monitors configured to monitor conditions of the stacked memory, and a system manager configured to receive the monitored conditions of the stacked memory from the one or more memory monitors, and dynamically adjust operation of the stacked memory based on the monitored conditions.

In some aspects, the techniques described herein relate to a system, wherein the system manager dynamically adjusts operation of a logic die coupled to the stacked memory.

In some aspects, the techniques described herein relate to a system, wherein the monitored conditions include at least one of thermal conditions or voltage droop conditions of the stacked memory.

In some aspects, the techniques described herein relate to a system, wherein the one or more memory monitors monitor conditions of different portions of the stacked memory.

In some aspects, the techniques described herein relate to a system, wherein the stacked memory includes a plurality of dies, and wherein the one or more memory monitors include a memory monitor for each of the plurality of dies of the stacked memory.

In some aspects, the techniques described herein relate to a system, wherein the system manager is configured to adjust operation of a logic die coupled to the stacked memory by throttling a frequency or voltage to prevent overheating of at least a portion of the logic die.

In some aspects, the techniques described herein relate to a system, wherein the system manager is configured to adjust operation of a logic die coupled to the stacked memory by providing change signals to change a voltage or frequency for operating one or more portions of the logic die.

In some aspects, the techniques described herein relate to a system, wherein the system manager is configured to adjust operation of the stacked memory by providing change signals to change a voltage or frequency for operating one or more portions of the stacked memory.

In some aspects, the techniques described herein relate to a system, wherein the system manager is configured to adjust operation of the stacked memory by refreshing one or more portions of the stacked memory.

In some aspects, the techniques described herein relate to a system including: a memory, at least one register configured to store a ranking for each of a plurality of portions of the memory, each respective ranking determined based on an associated retention time of a respective portion of the memory, and a memory controller to dynamically refresh different portions of the memory at different times based on the ranking for each of the plurality of portions of the memory stored in the at least one register.

In some aspects, the techniques described herein relate to a system, wherein the at least one register is implemented at the memory controller or at an additional portion of an interface between the memory and a logic die.

In some aspects, the techniques described herein relate to a system, wherein the memory includes a dynamic random access memory (DRAM).

In some aspects, the techniques described herein relate to a system, wherein the different portions of the memory correspond to different dies of the DRAM.

In some aspects, the techniques described herein relate to a system, wherein the dies of the DRAM are arranged in a stacked configuration.

In some aspects, the techniques described herein relate to a system, wherein the different portions of the memory correspond to individual rows of the memory.

In some aspects, the techniques described herein relate to a system, wherein the different portions of the memory correspond to individual banks of the memory.

In some aspects, the techniques described herein relate to a system, further including a logic die to schedule different workloads in the different portions of the memory based on the ranking for each of the plurality of portions of the memory.

In some aspects, the techniques described herein relate to a system including: a memory, retention bits associated with respective portions of the memory, the retention bits indicating whether each respective portion is ready to be refreshed, and a memory controller to poll the retention bits to determine whether the respective portion is ready to be refreshed, and to initiate a refresh of the portions of the memory based on the polling.

In some aspects, the techniques described herein relate to a system, wherein the retention bits are designed to enable a read without a write back.

In some aspects, the techniques described herein relate to a system, wherein the retention bits have separate read and write paths.

FIG. 1 is a block diagram of a non-limiting example system 100 having a memory and a controller operable to implement dynamic memory operations. In this example, the system 100 includes processor 102 and memory module 104. Further, the processor 102 includes a core 106 and a controller 108. The memory module 104 includes memory 110. In one or more implementations, the processor 102 also includes a system manager 112. The memory module 104 optionally includes a processing-in-memory component (not shown).

In accordance with the described techniques, the processor 102 and the memory module 104 are coupled to one another via a wired or wireless connection. The core 106 and the controller 108 are also coupled to one another via one or more wired or wireless connections. Example wired connections include, but are not limited to, buses (e.g., a data bus), interconnects, through silicon vias, traces, and planes. Examples of devices in which the system 100 is implemented include, but are not limited to, servers, personal computers, laptops, desktops, game consoles, set top boxes, tablets, smartphones, mobile devices, virtual and/or augmented reality devices, wearables, medical devices, systems on chips, and other computing devices or systems.

The processor 102 is an electronic circuit that performs various operations on and/or using data in the memory 110. Examples of the processor 102 include, but are not limited to, a central processing unit (CPU), a graphics processing unit (GPU), a field programmable gate array (FPGA), an accelerated processing unit (APU), and a digital signal processor (DSP). The core 106 is a processing unit that reads and executes instructions (e.g., of a program), examples of which include to add, to move data, and to branch. Although one core 106 is depicted in the illustrated example, in variations, the processor 102 includes more than one core 106, e.g., the processor 102 is a multi-core processor.

In one or more implementations, the memory module 104 is a circuit board (e.g., a printed circuit board), on which the memory 110 is mounted. In variations, one or more integrated circuits of the memory 110 are mounted on the circuit board of the memory module 104. Examples of the memory module 104 include, but are not limited to, a TransFlash memory module, single in-line memory module (SIMM), and dual in-line memory module (DIMM). In one or more implementations, the memory module 104 is a single integrated circuit device that incorporates the memory 110 on a single chip or die. In one or more implementations, the memory module 104 is composed of multiple chips or dies that implement the memory 110 that are vertically ("3D") stacked together, are placed side-by-side on an interposer or substrate, or are assembled via a combination of vertical stacking or side-by-side placement.

The memory 110 is a device or system that is used to store information, such as for immediate use in a device, e.g., by the core 106 of the processor 102 and/or by a processing-in-memory component. In one or more implementations, the memory 110 corresponds to semiconductor memory where data is stored within memory cells on one or more integrated circuits. In at least one example, the memory 110 corresponds to or includes volatile memory, examples of which include random-access memory (RAM), dynamic random-access memory (DRAM), synchronous dynamic random-access memory (SDRAM), and static random-access memory (SRAM). Alternatively or in addition, the memory 110 corresponds to or includes non-volatile memory, examples of which include Ferro-electric RAM, Magneto-resistive RAM, flash memory, read-only memory (ROM), programmable read-only memory (PROM), erasable programmable read-only memory (EPROM), and electronically erasable programmable read-only memory (EEPROM).

In one or more implementations, the memory 110 is configured as a dual in-line memory module (DIMM). A DIMM includes a series of dynamic random-access memory integrated circuits, and the modules are mounted on a printed circuit board. Examples of types of DIMMs include, but are not limited to, synchronous dynamic random-access memory (SDRAM), double data rate (DDR) SDRAM, double data rate 2 (DDR2) SDRAM, double data rate 3 (DDR3) SDRAM, double data rate 4 (DDR4) SDRAM, and double data rate 5 (DDR5) SDRAM. In at least one variation, the memory 110 is configured as a small outline DIMM (SO-DIMM) according to one of the above-mentioned SDRAM standards, e.g., DDR, DDR2, DDR3, DDR4, and DDR5. It is to be appreciated that the memory 110 is configurable in a variety of ways without departing from the spirit or scope of the described techniques.

In one or more implementations, the system manager 112 includes or is otherwise configured to interface with various systems capable of updating operation of various components of the system 100, examples of which include but are not limited to an adaptive voltage scaling (AVS) system, an adaptive voltage frequency scaling (AVFS), and a dynamic voltage frequency system (DVFS). In accordance with the described techniques, the system manager 112 is thus configured to change a logic frequency or voltage (e.g., of one or more portions of the processor 102) at calibration and/or dynamically. In at least one variation, the system manager 112 (or a similar manager for the memory module 104) is configured to change a frequency or voltage to one or more portions of the memory module 104 at calibration and/or dynamically. The system manager 112 is implemented using one or more of hardware or software. In one example, for instance, the system manager 112 is or includes a processor. By way of example, the processor executes one or more processes to control and manage system hardware resources, such as power supplied to different parts of the system, temperatures across the system, configuring hardware as the system starts up, and so on. Alternatively or additionally, the system manager 112 is or includes a process being executed to perform one or more such tasks. In at least one variation, the system manager 112 is or includes firmware, such as for the processor implementing the system manager 112 to execute. Alternatively or in addition, the system manager includes or otherwise has access to one or more registers, e.g., that are written to for requesting services.

In conventional approaches, stacked memories (e.g., DRAM) are statically refreshed at a "static" or "fixed" rate, e.g., per Joint Electron Device Engineering (JEDEC) specification. Due to this, conventional approaches refresh all memories at a refresh rate which corresponds to a "worst case"/"pessimistic case" refresh time, such as around 64 milliseconds. However, this can limit instructions per cycle (IPC) and, due to "unnecessary" refreshes, the power overhead associated with such static refresh is higher than for the described memory refresh schemes and logic die computation with memory technology awareness.

By way of example, various conventional DDR5 configurations of DRAM have Performance-Power-Area (PPA) limitations when accessing data off-chip. A typical DRAM bit cell consists of a 1T-1C structure, where a capacitor is formed by a dielectric layer sandwiched between conductor plates. Conventionally-configured system IPC is limited by DRAM bandwidth and latency, such as with memory-heavy workloads. By way of contrast, the system 100 is capable of taking advantage of variations in 3D memories (e.g., DRAM) and improves IPC by reducing refresh overhead and/or by increasing performance (e.g., overclocking) dynamically of portions of a stacked memory capable of handling the increase.

High bandwidth memory (HBM) provides increased bandwidth and memory density, allowing multiple layers (e.g., tiers) of DRAM dies (e.g., 8-12 dies) to be stacked on top of one another with one or more optional logic/memory interface die. Such a memory stack can be connected to a processing unit (e.g., CPU and/or GPU) through silicon interposers, as discussed in more detail below in relation to FIG. 2. Alternatively or additionally, such a memory stack can be stacked on top of a processing unit (e.g., CPU and/or GPU), as discussed in more detail below in relation to FIG. 3. In one or more implementations, stacking the memory stack on top of a processing unit can provide further connectivity and performance advantages relative to connections through silicon interposers.

The controller 108 is a digital circuit that manages the flow of data to and from the memory 110. By way of example, the controller 108 includes logic to read and write to the memory 110 and interface with the core 106, and in variations a processing-in-memory component. For instance, the controller 108 receives instructions from the core 106 which involve accessing the memory 110 and provides data to the core 106, e.g., for processing by the core 106. In one or more implementations, the controller 108 is communicatively located between the core 106 and the memory module 104, and the controller 108 interfaces with both the core 106 and the memory module 104.

Figure 2:
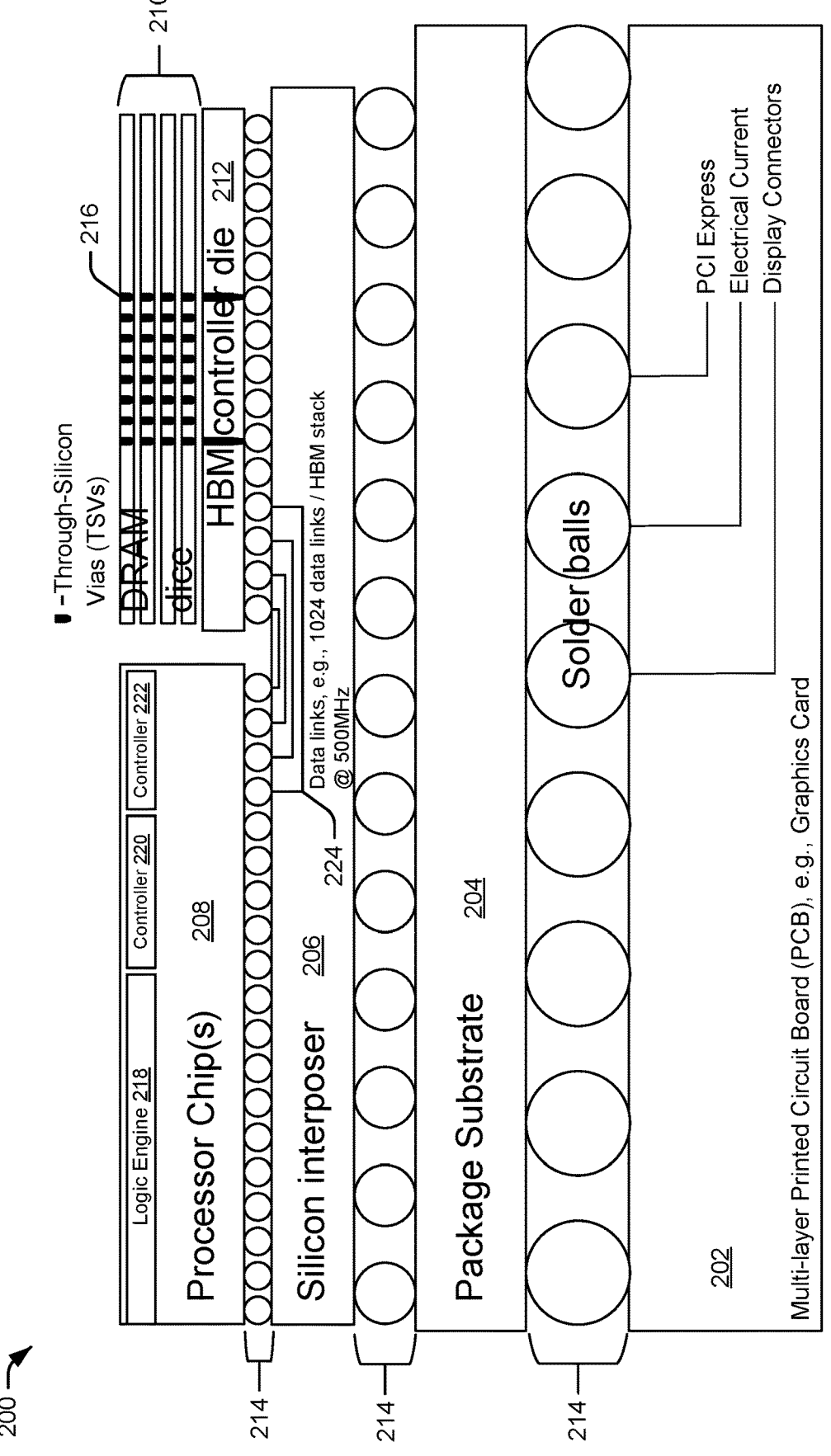
FIG. 2 depicts a non-limiting example of a printed circuit board architecture for a high bandwidth memory system.

FIG. 2 depicts a non-limiting example 200 of a printed circuit board architecture for a high bandwidth memory system.

The illustrated example 200 includes a printed circuit board 202, which is depicted as a multi-layer printed circuit board in this case. In one example, the printed circuit board 202 is used to implement a graphics card. It should be appreciated that the printed circuit board 202 can be used to implement other computing systems without departing from the spirit or scope of the described techniques, such as a central processing unit (CPU), a graphics processing unit (GPU), a field programmable gate array (FPGA), an accelerated processing unit (APU), and a digital signal processor (DSP), to name just a few.

In the illustrated example 200, the layers of the printed circuit board 202 also include a package substrate 204, a silicon interposer 206, processor chip(s) 208, memory dies 210 (e.g., DRAM dies), and a controller die 212 (e.g., a high bandwidth memory (HBM) controller die). The illustrated example 200 also depicts a plurality of solder balls 214 between various layers. Here, the example 200 depicts the printed circuit board 202 as a first layer and the package substrate 204 as a second layer with a first plurality of solder balls 214 disposed between the printed circuit board 202 and the package substrate 204. In one or more implementations, this arrangement is formed by depositing the first plurality of the solder balls 214 between the printed circuit board 202 and the package substrate 204. Further, the example 200 depicts the silicon interposer 206 as a third layer, with a second plurality of the solder balls 214 deposited between the package substrate 204 and the silicon interposer 206. In this example 200, the processor chip(s) 208 and the controller die 212 are depicted on a fourth layer, such that a third plurality of the solder balls 214 are deposited between the silicon interposer 206 and the processor chip(s) 208 and a fourth plurality of the solder balls 214 are deposited between the silicon interposer 206 and the controller die 212. In this example, the memory dies 210 form an additional layer (e.g., a fifth layer) arranged "on top" of the controller die 212. The illustrated example 200 also depicts through silicon vias 216 in each die of the memory dies 210 and in the controller die 212, such as to connect these various components.

It is to be appreciated that systems for memory refresh schemes and/or logic die computation with memory technology awareness may be implemented using different architectures in one or more variations without departing from the spirit or scope of the described techniques. For example, any of the above-discussed components (e.g., the printed circuit board 202, the package substrate 204, the silicon interposer 206, the processor chip(s) 208, the memory dies 210 (e.g., DRAM dies), and the controller die 212 (e.g., a high bandwidth memory (HBM) controller die) may be arranged in different positions in a stack, side-by-side, or a combination thereof in accordance with the described techniques. Alternatively or in addition, those components may be configured differently than depicted, e.g., the memory dies 210 may include only a single die in one or more variations, the architecture may include one or more processor chips 208, and so forth. In at least one variation, one or more of the described components is not included in an architecture for implementing memory refresh schemes and/or logic die computation with memory technology awareness in accordance with the described techniques.

In this example 200, the processor chip(s) 208 is depicted including logic engine 218, a first controller 220, and a second controller 222. In variations, the processor chip(s) 208 includes more, different, or fewer components without departing from the spirit or scope of the described techniques. In one or more implementations, such as graphics card implementations, the logic engine 218 is configured as a three-dimensional (3D) engine. Alternatively or in addition, the logic engine 218 is configured to perform different logical operations, e.g., digital signal processing, machine learning-based operations, and so forth. In one or more implementations, the first controller 220 corresponds to a display controller. Alternatively or in addition, the first controller 220 is configured to control a different component, e.g., any input/output component. In one or more implementations, the second controller 222 is configured to control the memory, which in this example 200 includes the controller die 212 (e.g., a high bandwidth memory controller die) and the memory dies 210 (e.g., DRAM dies). Accordingly, one or more of the second controller 222 and/or the controller die 212 corresponds to the controller 108 in one or more implementations. Given this, in one or more implementations, the memory dies 210 correspond to the memory 110.

The illustrated example 200 also includes a plurality of data links 224. In one or more implementations, the data links 224 are configured as 1024 data links, are used in connection with a high bandwidth memory stack, and/or having a speed of 500 megahertz (MHz). In one or more variations, such data links are configured differently. Here, the data links 224 are depicted linking the memory (e.g., the controller die 212 and the memory dies 210) to the processor chip(s) 208, e.g., to an interface with the second controller 222. In accordance with the described techniques, data links 224 are useable to link various components of the system.

In one or more implementations, one or more of the solder balls 214 and/or various other components (not shown), such as one or more of the solder balls 214 disposed between the printed circuit board 202 and the package substrate 204, are operable to implement various functions of the system, such as to implement Peripheral Component Interconnect Express (PCIe), to provide electrical current, and to serve as computing-component (e.g., display) connectors, to name just a few. In the context of another architecture, consider the following example.

Figure 3:
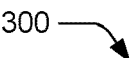
FIG. 3 depicts a non-limiting example of a stacked memory architecture.
Figure 3:
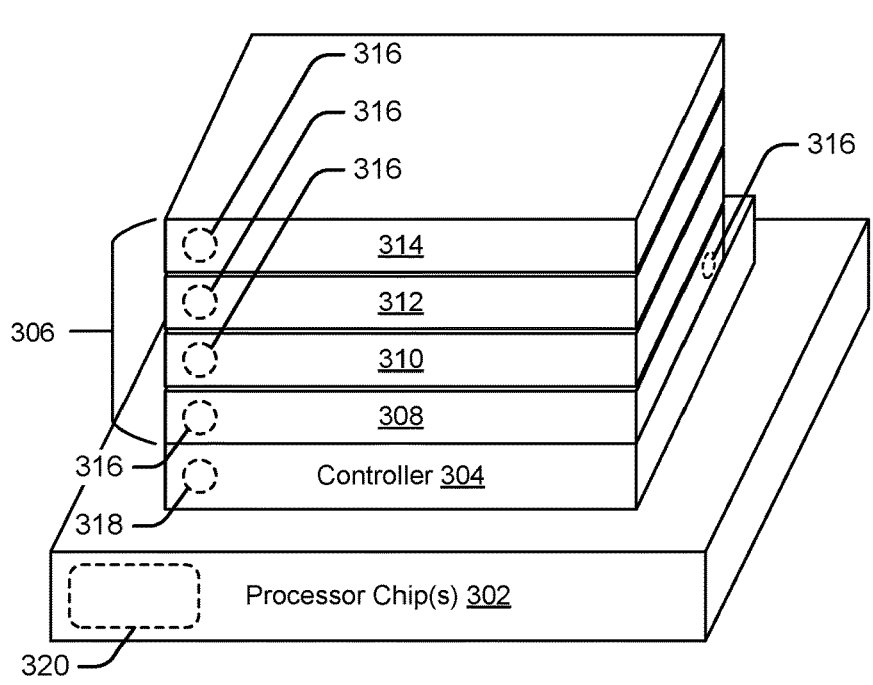

FIG. 3 depicts a non-limiting example 300 of a stacked memory architecture. The illustrated example 300 includes one or more processor chip(s) 302, a controller 304, and a memory 306 having a plurality of stacked portions, e.g., dies (e.g., four dies in this example). Although the memory 306 is depicted with four dies in this example, in variations, the memory 306 includes more (e.g., 5, 6, 7, or 8+) or fewer (e.g., 3 or 2) dies without departing from the spirit or scope of the described techniques. In one or more implementations, the dies of the memory 306 are connected, such as by trans silicon vias, hybrid bond, or other types of connections. In this example 300, the dies of the memory 306 include a first tier 308 (e.g., $T_0$), a second tier 310 (e.g., $T_1$), a third tier 312 (e.g., $T_2$), and a fourth tier 314 (e.g., $T_3$). In one or more implementations, the memory 306 corresponds to the memory 110. Additionally, in at least one variation, architectures which implement one or more of the described techniques optionally include memory monitors 316 (e.g., in-memory monitors), a controller monitor 318, and a monitor-aware system manager 320. By way of example, the monitor-aware system manager 320 corresponds to the system manager 112.

Memory monitors 316 are implementable in various ways in accordance with the described techniques. In one or more implementations, for instance, a memory monitor 316 is implemented in software. Alternatively or additionally, a memory monitor 316 is implemented in hardware. When implemented in software, for example, a memory monitor 316 is or uses an operating system memory counter (e.g., a server memory counter), such as an available bytes counter that indicates how many bytes of memory are available for use, a pages per second counter that indicates a number of pages that either were retrieved from disk due to hard page faults or written to disk to free space in a working set due to page faults, a memory page faults per second counter that indicates a rate of page faults for all processes including system processes, and/or a process page faults per second counter that indicates a rate of page faults for a given process. In at least one variation, a memory monitor 316 is a process executed by a processor that polls a respective portion or portions of memory at intervals and/or that is executed using the respective portion or portions of memory which the memory monitor 316 is configured to monitor. Alternatively or in addition, a memory monitor 316 tracks memory usage through one or more of system calls and/or system application programming interfaces that provide insights into a state of memory and/or a portion of the memory. When implemented in hardware, a memory monitor 316 is a device and/or logic that is integrated in (e.g., embedded in) a portion of memory which the memory monitor 316 is configured to monitor. Examples of hardware implementations of memory monitors 316 include logical or IP blocks integrated with the memory (or a portion of the memory) and/or controllers integrated with the memory (or a portion of the memory). In one or more hardware implementations, a memory monitor 316 includes one or more registers and/or logic units (arithmetic logic units or ALUs).

Returning to the discussion of the illustrated example 300, the processor chip(s) 302, the controller 304, and the dies of the memory 306 are arranged in a stacked arrangement, such that the controller 304 is disposed on the processor chip(s) 302, the first tier 308 of the memory 306 is disposed on the controller 304, the second tier 310 is disposed on the first tier 308, the third tier 312 is disposed on the second tier 310, and the fourth tier 314 is disposed on the third tier 312. In variations, components of a system for memory refresh schemes and/or logic die computation with memory technology awareness are arranged differently, such as partially stacked and/or partially side by side.

In one or more implementations, the memory 306 corresponds to a DRAM and/or high bandwidth memory (HBM) cube stacked on a compute chip, such as the processor chip(s) 302. Examples of the processor chip(s) 302 include, but are not limited to, a CPU, GPU, FPGA, or other accelerator. In at least one variation, the system also includes the controller 304 (e.g., a memory interface die) disposed in the stack between the processor chip(s) 302 and the memory 306, i.e., stacked on top of the processor chip(s) 302. Alternatively or additionally, the controller 304 is on a same die as the processor chip(s) 302, e.g., in a side-by-side arrangement. This arrangement, when used with the described techniques, results in increased memory density and bandwidth, with minimal impact to power and performance to alleviate memory bottlenecks to system performance. Such arrangements can also be used in connection with the described refresh techniques with various other types of memories, such as FeRAM and MRAM.

As noted above, in conventional approaches, stacked memories (e.g., DRAM) are statically refreshed at a "static" or "fixed" rate, e.g., per Joint Electron Device Engineering (JEDEC) specification. Due to this, conventional approaches refresh all memories at a refresh rate which corresponds to a "worst case" or "pessimistic case" refresh time, such as around 64 milliseconds.

By stacking multiple DRAM dies (e.g., the multiple tiers of the memory 306), the described techniques take advantage of variations in retention time between the stacked DRM dies, such as by taking advantage in a variation between a first retention time of the first tier 308 of the memory 306 and a second retention time of the second tier 310 of the memory 306. In one or more implementations, these variations are taken advantage of to "buy back" performance and power.

In at least one implementation, this is achieved by employing dynamic refresh (of a stacked memory 306) rather than static refresh. In one example of dynamic refresh, the memory 306 is characterized to associate different retention times with portions of the memory. The portions of the memory are ranked based on the associated retention times. This ranking can then be stored to provide knowledge of the variable retention times of the memory 306, not only to the controller 304 to perform dynamic refresh and allocate memory, but also the logic dies, to take advantage of the memory technology properties. The ranking can be stored in a register of the system. As described herein, the register corresponds to a storage unit that is accessible by the controller 304. For example, in some cases the ranking is stored in a register of the controller 304. In other implementations the ranking is stored in a register or storage unit that can be accessed by the controller 304, such as in a register implemented at a memory interface or a logic die. For example, the register is implemented at a portion of an interface between a logic die and a memory die. The portions of the memory are then dynamically refreshed at different times based on the ranking.

In another example of dynamic refresh, the system leverages two or more retention bits in portions (e.g., every row) of the memory 306, which are configured to represent a weak logic 1 and weak logic 0, which is discussed in more detail in FIGS. 4 and 5 below.

As noted above, in one or more implementations, the memory 306 optionally includes memory monitors 316. Here, each tier of the memory 306 is depicted having at least one memory monitor 316, and the first tier 308 of the memory 306 is depicted including two memory monitors 316. In variations, however, portions of the memory 306 (e.g., dies) include different numbers of memory monitors 316 (e.g., less than 1 per die, 1 per die, more than 1 per die, and so on) without departing from the spirit or scope of the described techniques. Also in variations, the memory monitors 316 are positioned in different physical locations of the memory 306 in accordance with the described techniques.

In one or more variations where the architecture includes the memory monitors 316, the controller 304 optionally includes the controller monitor 318 and the processor chip(s) 302 optionally include the monitor-aware system manager 320. In variations, the controller 304 includes more than one controller monitor 318, and physical locations of the one or more controller monitors 318 within the controller 304 are variable without departing from the described techniques.

Broadly, the memory monitors 316 are configured to detect one or more conditions of a portion of the memory, such as thermal conditions (e.g., a thermal sensor), voltage droop conditions, and/or memory retention. In one or more implementations, the memory monitors 316 detect one or more conditions of portions of the memory that provide input to a logic die, e.g., the processor chip(s) 302 or one or more portions thereof. Similarly, the controller monitor 318 is configured to detect one or more conditions of the controller 304 or of a portion of the controller 304. The detected conditions are communicated to the monitor-aware system manager 320.

The monitor-aware system manager 320 adjusts operation of the memory 306 (or portions of the memory) statically and/or dynamically based on the detected conditions. Alternatively or in addition, the monitor-aware system manager 320 adjusts operation of the processor chip(s) 302 (e.g., logic die) dynamically. For example, the monitor-aware system manager 320 provides change signals to change one or more of a voltage or frequency for operating one or more portions of the memory 306, e.g., to overclock one or more portions and not overclock one or more other portions and/or to overclock one or more portions of memory differently from one or more other portions of the memory. Alternatively or in addition, the monitor-aware system manager 320 provides change signals to change one or more of a voltage or frequency for operating one or more portions of the processor chip(s) 302, e.g., to overclock one or more portions and not overclock one or more other portions and/or to overclock one or more portions of processor chip(s) 302 differently from one or more other portions of the memory. Alternatively or in addition, the monitor-aware system manager 320 updates refresh of one or more portions of the memory 306, e.g., updates the refresh of one or more portions of the memory 306 differently from one or more other portions of the memory 306.

In memory (e.g., a DRAM), retention time can vary for different reasons, such as due to static manufacturing defects and variation, dynamic thermal variation, dynamic rowhammering (e.g., of neighboring rows causing additional leakage from storage capacitors in bit cells (DRAM 1T-1C bit cells), and aging of the components in the memory, which depreciates the retention of the memory over the lifetime of the system.

In the context of a stacked arrangement, such as the arrangement depicted in the example 300, for instance, the first tier 308 of the memory 306 is likely to experience a largest thermal gradient since the first tier 308 is closest to the compute die (e.g., the processor chip(s) 302) and because in many cases logic dies (of compute chips) have higher activity and often generate more heat than memory dies. Additionally, in one or more implementations, memory cells within a particular portion of the memory 306, such as a portion of the memory 306 physically closer to hot-logic IP blocks of the processor chip(s) 302, also generate more heat than other functional blocks which causes a larger gradient in retention time variation due to thermal effects. Examples of such portions of the memory 306 include one or more cells (e.g., DRAM cells) of the first tier 308 of memory 306 located above logic IP blocks of the processor chip(s) 302, such as execution units and scheduler. Unlike conventional approaches, which do not track thermal conditions or voltage droop conditions across individual memory die, in one or more variations, the system does track thermal conditions and/or voltage droop conditions across individual memory by configuring a memory die to include multiple memory monitors 316 (e.g., thermal, retention, etc.) and/or by detecting thermal conditions and/or voltage droop conditions of one memory die, in part, by using a memory monitor 316 on another memory die.

In accordance with the described techniques, the monitor-aware system manager 320 is configured to dynamically or adaptively scale voltage and/or frequency. The monitor-aware system manager 320 receives information from one or more of the memory monitors 316 and/or one or more controller monitors 318, which capture thermal gradients within one or more of the dies. Based on the information, the monitor-aware system manager 320 throttles frequency and/or voltage (e.g., for portions of the processor chip(s) 302), such as to prevent overheating of a die. The monitor-aware system manager 320 also derives a voltage-frequency relationship to optimize performance (e.g., maximize performance) and power (e.g., minimize power usage) for the system.

In one or more implementations, the described techniques account for multi-tier thermal effects (of the memory 306) using the monitor-aware system manager 320 by (1) integrating the controller monitor 318 (e.g., thermal sensors) into the controller 304 (e.g., memory interface logic), and (2) integrating the memory monitors 316 (e.g., thermal sensors and/or retention monitors) into one or more tiers of the memory 306 in single or multiple locations of the memory dies, such as to capture varying thermal sources underneath (and/or above) a memory tier. This is because different logic IP blocks correspond to different thermal sources and the thermal effects due to those sources is capable of differing.

In the context of the example 300, for instance, the first tier 308 of the memory 306 is more likely than the other tiers to be impacted by workloads at different portions of the memory 306, logic-die heating, and/or degradation over time. In one or more implementations, one or more of the memory monitors 316 are calibrated at wafer sort or after packaging and fused to account for unique "worst" case retention time of each tier. In variations, one or more of the memory monitors 316 are fused within the tiers of the memory 306 at different granularity to capture varying thermal variation across a tier (e.g., across the first tier 308 of the memory 306).

Based on this, the monitor-aware system manager 320 determines whether the information from the memory monitors 316 indicates that thermal variation and/or manufacturing variation causes retention of the memory 306 (or portions of the memory 306) to fall below a threshold retention time. In one or more implementations, the monitor-aware system manager 320 dynamically, during operation of the system, tracks the information from the memory monitors 316 to capture aging effects of the memory that impact retention time of the bit cells. This includes adjusting the memory monitors 316, during operation, with updated retention time of the tiers of the memory 306 based on aging and/or rowhammering. In such implementations, the system sets the threshold to control the monitor-aware system manager 320 (e.g., an AVFS system).

In conventional approaches, retention time is typically referred to as a single value for an entire memory (e.g., an entire DRAM or HBM), such as according to JEDEC. In contrast to conventional approaches, the described techniques integrate one or more retention monitors (e.g., memory monitors 316) for logic 0 and logic 1, e.g., into each of the tiers of the memory 306. In one or more implementations, the described techniques determine a preferential retention for each of the multiple memory tiers (e.g., for each die), such as at calibration time. This preferential retention (for logic 0's or logic 1's) of each die is stored in a register file, e.g., of the controller 304. In at least one variation, logic is integrated into the controller 304 (e.g., the memory interface controller) to assign data that is predominantly 1's to tiers that have a preference for logic 1, and data that is predominantly 0's to tiers that have a preference for logic 0. The system determines whether data is predominantly 0's or 1's using one or more techniques, such as by computing a checksum or derivative of a checksum on the data. Additionally or alternatively, the memory interface/controller die (e.g., the controller 304) includes logic to transform data to include more 0's or 1's. For instance, the memory interface/controller die transforms data to include more 0's than 1's where retention in the memory 306 (or a tier) of logic 0 is longer than retention of logic 1. By way of example, the logic transforms the data by storing a 1's complement of the data, if it is dominated by the undesired value (e.g., not the value for which the tier has a preference), and by appending a bit to indicate if the true value or complemented value is stored.

In one or more implementations, the described techniques assign various data and/or applications to operate using different portions of the memory 306, such as different tiers of the memory 306. This is because some types of data and applications result in more frequent data updates and/or lower data residency than others. By way of example, GPU frame buffers are typically updated more frequently than data written by CPUs. In at least one variation, the system (e.g., the controller 304) includes logic that causes the controller 304 to assign data maintained by a GPU frame buffer to tiers of the memory 306 that are determined to have a lower retention. In connection with operation, such data is refreshed more frequently by a corresponding application and thus is paired with a portion of the memory having a condition (e.g., lower retention) that is complementary with a characteristic of the data, e.g., more frequent refresh. This contrasts with data refreshed less frequently, such as data that is refreshed as an overhead like CPU data which is generally updated less frequently. In one or more implementations, the controller 304 assigns such CPU data to portions of the memory 306 (e.g., tiers) that are determined to have relatively higher retention. In at least one variation, various workloads that involve accessing memory are profiled based on characteristics of memory access (e.g., frequency of updates) associated with running those workloads. The workloads are then assigned to portions of the memory based on the profiling, such as to assign a workload to a portion of the memory which operates under a condition that is complementary with characteristics of the workload (or more complementary than with the characteristics of other workloads which are better suited to be assigned to a different portion of the memory). In one or more implementations, for example, a logic die schedules (e.g., through implementation of a scheduler) different workloads in the different portions of the memory based on the ranking, where the ranking is indicative of retention time. In operation, some workloads are modified often and thus are capable of tolerating bit cells that have lower retention time. By way of example, workloads implemented on GPUs can involve accessing memory much more frequently and therefore tolerate bit cells of memory (e.g., portions of memory) that have lower retention time than other types of workloads and/or operations.

In various scenarios, applications, like probabilistic computing, tolerate least significant bit (LSB) errors. In one or more implementations, the monitor-aware system manager 320 ranks portions of the memory 306. For example, the monitor-aware system manager 320 ranks bits, rows, banks, and/or dies of the memory 306. The monitor-aware system manager 320 also stores data based on least- or most-significant bit characteristics and based on monitored conditions of the portions of the memory 306. By way of example, the monitor-aware system manager 320 stores LSB data in portions of the memory having lower retention (according to the ranking) and stores most significant bit (MSB) data in portions of the memory having higher retention (according to the ranking). In one or more implementations, the dies of the memory 306 are stacked on one another and on the processor chip(s) 302, such that functional blocks that produce more heat are aligned with LSB bits of the memory 306 that is stacked above.

Although a stacked configuration having multiple memory dies is discussed just above, it is to be appreciated that in one or more implementations, the memory may include only a single die stacked on the controller 304 and/or the processor chip(s) 302. In this context, consider FIG. 4.

Figure 4:
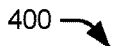
FIG. 4 depicts a non-limiting example of a memory array that stores retention bits for dynamically refreshing memory.
Figure 4:
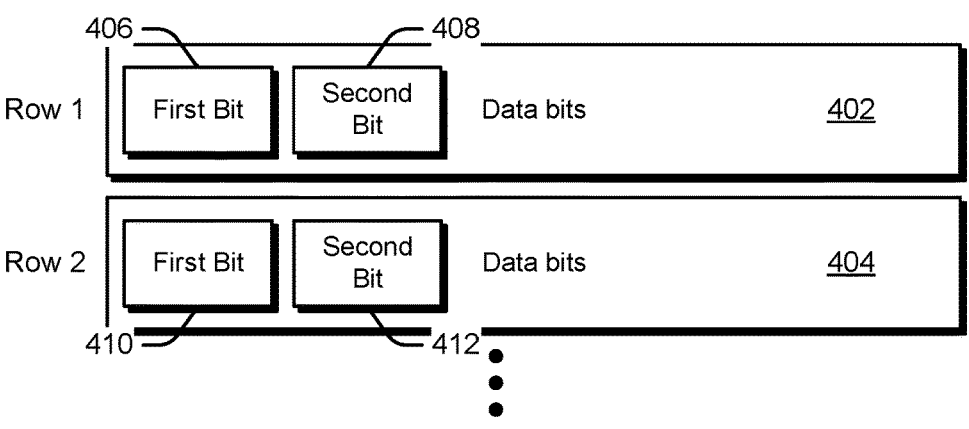

FIG. 4 depicts a non-limiting example 400 of a memory array that stores retention bits for dynamically refreshing memory.

The memory array of example 400 utilizes "retention bits" associated with different portions of the memory. For instance, example 400 depicts a first portion 402 and a second portion 404 of a memory 306. The first and second portions may correspond to different portions of the memory 306, such as different rows of the memory, different dies of the memory 306, different banks of the memory 306, and so forth. In this example, the first portion 402 includes a first retention bit 406 and a second retention bit 408, and the second portion 404 also includes a first retention bit 410 and a second retention bit 412.

In one or more implementations, the first retention bit and the second retention bit of each portion represent a weak logic 1 and a weak logic 0, respectively. The retention bits are configured to "leak" faster than the rest of the data stored in the associated portion, and thus the retention bits thus act as an early canary to indicate that the particular portion of the memory associated with the retention bits is ready to be refreshed early. In one or more implementations, the retention bits are "polled", e.g., by controller 304, at predetermined intervals of time. Notably, such polling may result in an overhead in power consumption. Doing so, however, reduces the number of times each row of the memory must be refreshed because each row is dynamically refreshed only if the retention bits indicate the row is ready to be refreshed. Notably, this gives back performance while also increasing availability of the memory.

Generally, "off-chip" memories (e.g., DRAM) are implemented with a destructive read, and thus using retention bits may not be suitable for conventional systems which utilize off-chip memories. This is because polling the retention bits will cause the retention bits to be read, and then written back. Doing so would cause a fresh set of retention bits to be written each time the retention bits are polled, thereby destroying the history of the data in the associated portion of the memory.

To overcome this problem, the retention bits are configured to allow polling without destructive reads. To do so, the retention bits are implemented as a bitcell that is different than DRAM, but can mimic the DRAM bitcell to capture the retention time and stored value degradation. In one or more implementations, the retention bits are configured as special two port cells (e.g., 2T gain-cell DRAM), where the stored data will not be destroyed on a read. Notably, these special two port cells have a similar retention time as off-chip DRAM, or slightly worse to enable the retention bits to function as a canary. In contrast to conventionally configured DRAM, these bitcells are implemented with separate read and write paths so that the stored charge is not destroyed on a read. The retention bits can be polled such that the retention bits are accessed separately from the actual bits of the memory portion so as not to trigger a read and write-back for all of the bits in the respective portion of memory that takes place as part of the DRAM read operation.

Figure 5:
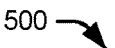
FIG. 5 depicts an example of a retention bit structure for dynamically refreshing memory.
Figure 5:
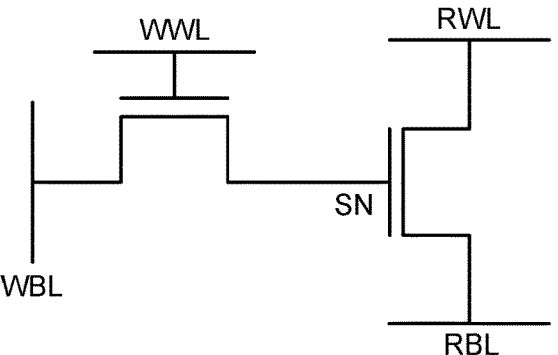

FIG. 5 depicts an example 500 of a retention bit structure for dynamically refreshing memory. The retention bit structure of FIG. 5 is based on 2T-gain cell DRAM circuit. Other bits in the DRAM WL, will be tied to WWL. Hence polling during refresh enables only a read through RWL without disturbing the SN on the retention bit, or triggering a write-back on the DRAM row word-line bits.

In one or more implementations, the retention bits are used to characterize the discrete retention time for each memory tier and employ a hybrid refresh technique that refreshes the DRAM stack at discrete refresh rates assigned to each tier, i.e., static refresh can be performed within die, but each stacked die has its own designated/required refresh time. For example, tier 0, is refreshed at refresh rate "r0", and tier 1 is refreshed at "r1" rate (which is different from r0), and so on, which could be characterized at a "calibration" phase, and dynamically at inserted checkpoints to recalibrate the retention times of the tiers capturing how these retention times change over time for the memory tiers.

In one or more implementations, the use of retention bits is extended to protect against row hammer. For example, the retention bits described above store time-dependent history and "leakage" in the bit cell, thus providing an early indication of the leakage caused by neighboring row hammering as well. Instead of tracking rowhammering in the memory controller which is the case when static refresh is employed, the polling of the retention bits during dynamic refresh at the intra-tier level will capture rowhammer related "leakage" and issue a refresh through the polling.

Soft error ECC checks could also be used as a proxy to determine when to initiate a refresh. For example, a processing-in-memory component performs ECC at a bank level, and this could be utilized to perform refresh at the bank-level or vice versa (refresh polling could be used to feed into ECC checks).

Figure 6:
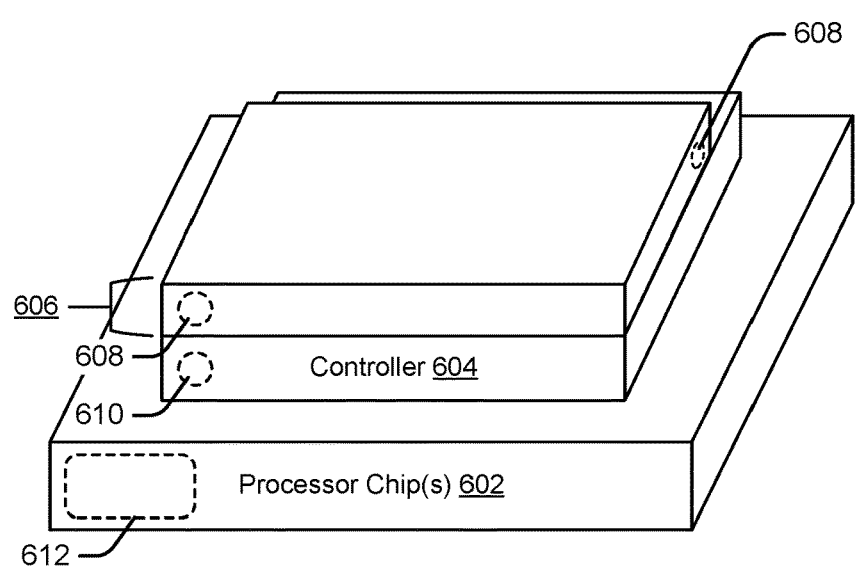
FIG. 6 depicts a non-limiting example of another stacked memory architecture.

FIG. 6 depicts a non-limiting example 600 of another stacked memory architecture. The illustrated example 600 includes one or more processor chip(s) 602, a controller 604, and a memory 606. In at least one variation, the memory 606 is non-volatile memory, such as Ferro-electric RAM or Magneto resistive RAM. Alternatively, the memory 606 is a volatile memory, example of which are mentioned above. In variations, the components (e.g., the one or more processor chip(s) 602, the controller 604, and the memory 606) are connected in any of a variety of ways, such as those discussed above. Given this, in one or more scenarios, the memory 606 corresponds to the memory 110. In at least one variation, the stacked memory architecture optionally includes memory monitors 608 (e.g., in-memory monitors such as thermal sensor and/or retention monitors), a controller monitor 610, and a monitor-aware system manager 612. In one or more implementations, the monitor-aware system manager 612 corresponds to the system manager 112.

In this example 600, the processor chip(s) 602, the controller 604, and the memory 606 are arranged in a stacked arrangement, such that the controller 604 is disposed on the processor chip(s) 602, and the memory 606 is disposed on the controller 604. As noted above, components of a system for memory refresh schemes and/or logic die computation with memory technology awareness are arranged differently in variations without departing from the spirit of the described techniques. In variations where the architecture includes the memory monitors 608, the controller monitor 610, and the monitor-aware system manager 612, those components include the same and/or similar functionality as discussed above in relation to FIG. 3.

In one or more implementations where the memory 606 is a non-volatile memory, the memory 606 has a higher temperature tolerance than one or more volatile-memory implementations. Broadly, the monitor-aware system manager 612 is configured to throttle frequency and voltage based on the cooling/packaging and heat generated by logic die, as indicated by the information from the memory monitors 608. Because various non-volatile memories have higher temperature tolerance, in at least one variation, the monitor-aware system manager 612 is configured overdrive voltage and frequency further than relative to one or more volatile-memory configurations. In such scenarios, the monitor-aware system manager 612 receive input of the non-volatile memory's thermal properties, which are calibrated at a wafer sort/packaging step and/or dynamically at regular check points, and in so doing achieves higher system performance and lower power usage than other approaches that utilize stacked memory configurations with non-volatile memory.

As noted above, in one or more implementations, the described techniques determine a preferential retention for memory die (e.g., the memory 606), such as at calibration time. This preferential retention (for logic 0's or logic 1's) of the die is stored in a register file, e.g., of the controller 604. In at least one variation, the monitor-aware system manager 612 tunes a voltage level to boost writes for the non-preferential value to improve performance overall at minimal power overhead. As another example arrangement of components, consider the following example of FIG. 7.

Figure 7:
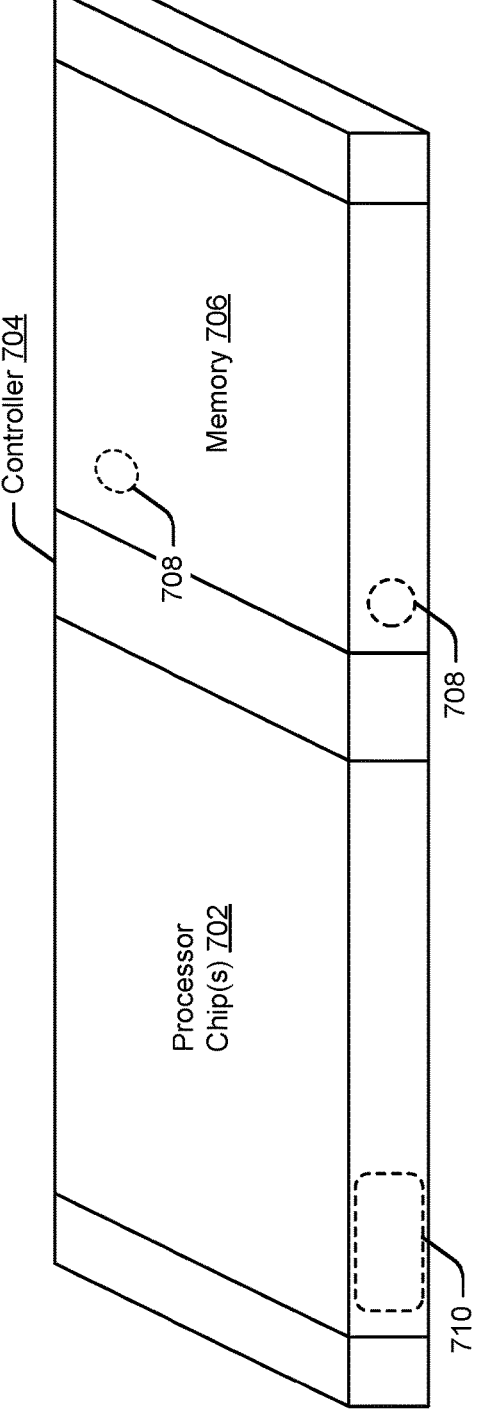
FIG. 7 depicts a non-limiting example of a non-stacked memory architecture having a memory and processor on a single die.

FIG. 7 depicts a non-limiting example 700 of a non-stacked memory architecture having a memory and processor on a single die. The illustrated example 700 includes one or more processor chip(s) 702, a controller 704, and a memory 706. In at least one variation, the memory 706 is non-volatile memory, such as a logic compatible Ferro-electric RAM or Magneto resistive RAM. Alternatively, the memory 706 is a volatile memory, examples of which are mentioned above. In variations, the components (e.g., the one or more processor chip(s) 702, the controller 704, and the memory 706) are connected in any of a variety of ways, such as those discussed above. In one or more implementations, the architecture also includes memory monitors 708 (e.g., in-memory monitors such as thermal sensor and/or retention monitors) and a monitor-aware system manager 710. Although not depicted, in one or more implementations the controller 704 also includes a controller monitor.

In at least one example, such as the illustrated example 700, the one or more processor chip(s) 702, the controller 704, and the memory 706 are disposed side-by-side on a single die, e.g., each of those components is disposed on a same die. For instance, the controller 704 is connected in a side-by-side arrangement with the processor chip(s) 702, and the memory 706 is connected in a side-by-side arrangement with the controller 704, such that the controller 704 is disposed between the memory 706 and the processor chip(s) 702. In variations, the components of a system for memory refresh schemes and/or logic die computation with memory technology awareness are arranged in different side-by-side arrangements (or partial side-by-side arrangements) without departing from the spirit or scope of the described techniques. In one or more implementations, the memory monitors 708 and the monitor-aware system manager 710 include functionality similar to that discussed above in relation to FIG. 3.

Figure 8:
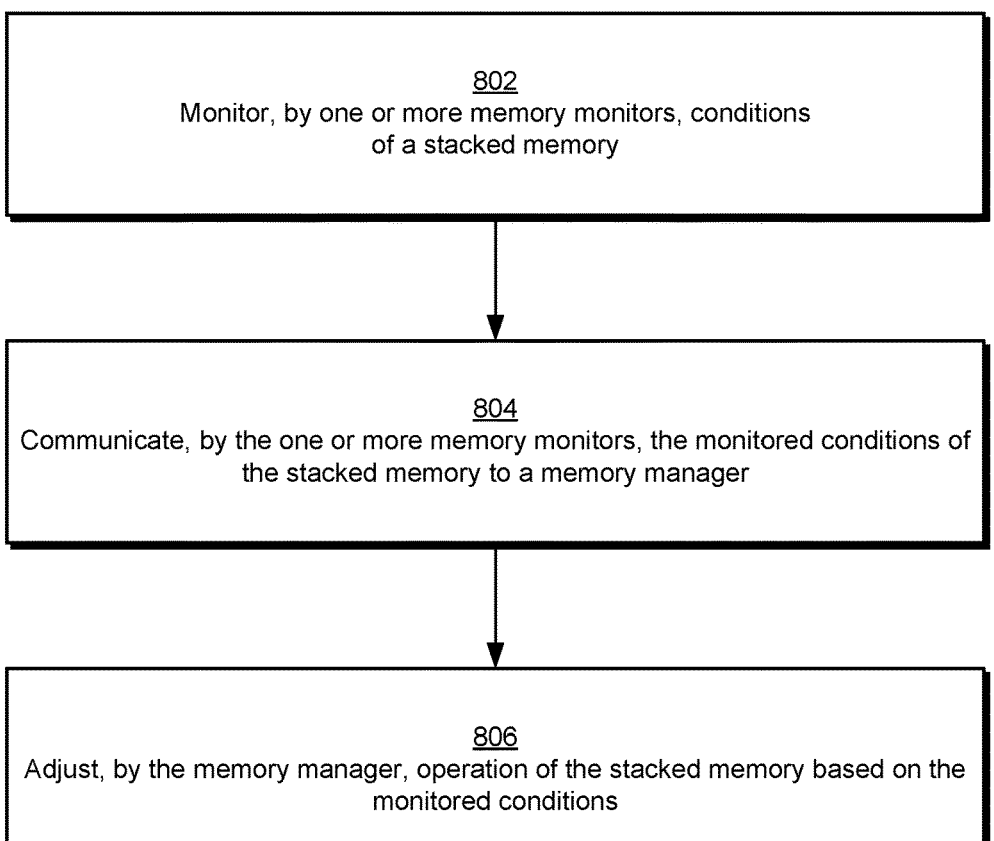
FIG. 8 depicts a procedure in an example implementation of dynamic memory operations.

FIG. 8 depicts a procedure in an example 800 implementation of dynamic memory operations.

Conditions of a stacked memory are monitored by one or more memory monitors (block 802). The monitored conditions of the stacked memory are communicated by the one or more memory monitors to a system manager (block 804). Operation of the stacked memory is adjusted by the memory monitor based on the monitored conditions (block 806).

Figure 9:
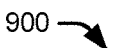
FIG. 9 depicts a procedure in an additional example implementation of dynamic memory operations.
Figure 9:
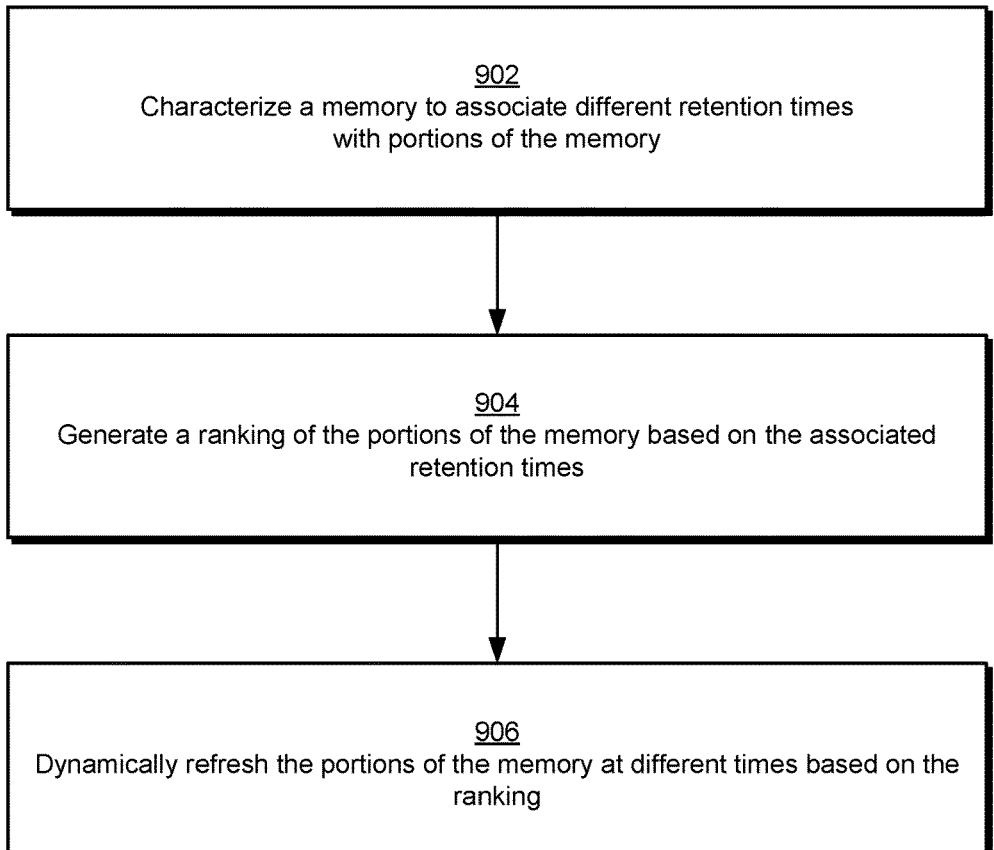

FIG. 9 depicts a procedure in an additional example 900 implementation of dynamic memory operations.

A memory is characterized to associate different retention times with portions of the memory (block 902). By way of example, portions (e.g., rows, dies, or banks) of memory 306 are characterized to associate respective retention times with different portions of the memory 306.

The portions of the memory are ranked based on the associated retention times (block 904). By way of example, the portions (e.g., rows, dies, or banks) of the memory 306 are ranked based on the associated retention determined from the memory characterization performed at block 802.

The portions of the memory are dynamically refreshed at different times based on the ranking (block 906). By way of example, the different portions of the memory 306 are refreshed banked on the ranking. Doing so contrasts with the static refresh performed by conventional systems in which all portions of the memory are refreshed at the same time.

FIG. 10 depicts a procedure in an additional example 1000 implementation of dynamic memory operations.

Retention bits associated with individual portions of a memory are polled to determine whether to refresh the individual portions of the memory (block 1002). In accordance with the techniques discussed herein, the polling causes a read of the retention bits without a write back, which stores a time-dependent history and leakage in the bit cell. The individual portions of the memory are refreshed at different times based on the polling (block 1004).

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the memory 110, the controller 108, and the core 106) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system comprising:
a stacked dynamic random-access memory (DRAM) in a package;
a controller to interface with the stacked DRAM;
one or more memory monitors configured to detect conditions of the stacked DRAM; and
a system manager implemented on a processor chip in the package and configured to:
receive the detected conditions of the stacked DRAM from the one or more memory monitors; and
interface with one or more systems to dynamically adjust at least one of a voltage or a frequency for operating individual DRAM die of the stacked DRAM based on the detected conditions.

2. The system of claim 1, wherein the system manager dynamically adjusts operation of a logic die coupled to the stacked DRAM.

3. The system of claim 1, wherein the detected conditions include at least one of thermal conditions or voltage droop conditions of the stacked DRAM.

4. The system of claim 1, wherein the one or more memory monitors detect conditions of different portions of the stacked DRAM.

5. The system of claim 1, wherein the stacked DRAM includes a plurality of dies, and wherein the one or more memory monitors include a memory monitor for each of the plurality of dies of the stacked DRAM.

6. The system of claim 1, wherein the system manager is configured to adjust operation of a logic die coupled to the stacked DRAM by throttling the frequency or the voltage to prevent overheating of at least a portion of the logic die.

7. The system of claim 1, wherein the one or more systems include at least one of an adaptive voltage scaling system, an adaptive voltage frequency scaling system, or a dynamic voltage frequency system.

8. The system of claim 1, wherein the system manager is configured to adjust operation of the stacked DRAM by providing change signals to change the voltage or the frequency for operating one or more portions of the stacked DRAM.

9. The system of claim 1, wherein the system manager is configured to adjust operation of the stacked DRAM by refreshing one or more portions of the stacked DRAM.

10. A device in a package communicably coupled to a stacked dynamic random-access memory (DRAM) in the package and one or more memory monitors, the device comprising:
a controller to interface with the stacked DRAM; and
a system manager implemented on a processor chip in the package configured to:
receive conditions of the stacked DRAM detected by the one or more memory monitors; and
interface with one or more systems to dynamically adjust at least one of a voltage or a frequency for operating individual DRAM die of the stacked DRAM based on the received conditions.

11. The device of claim 10, wherein the device is further configured to dynamically adjust operation of a logic die coupled to the stacked DRAM.

12. The device of claim 10, wherein the received conditions include at least one of thermal conditions or voltage droop conditions of the stacked DRAM.

13. The device of claim 10, wherein the received conditions are detected for different portions of the stacked DRAM.

14. The device of claim 10, wherein the device is further configured to adjust operation of a logic die coupled to the stacked DRAM by throttling the frequency or the voltage to prevent overheating of at least a portion of the logic die.

15. The device of claim 10, wherein the device is further configured to adjust operation of a logic die coupled to the stacked DRAM by providing change signals to change the voltage or frequency for operating one or more portions of the logic die.

16. The device of claim 10, wherein the device is further configured to adjust operation of the stacked DRAM by refreshing one or more portions of the stacked DRAM.

17. The device of claim 16, wherein the one or more portions of the stacked DRAM comprise different dies of the stacked DRAM.

18. The device of claim 16, wherein the one or more portions of the stacked DRAM correspond to individual rows of the stacked DRAM.

19. The device of claim 16, wherein the one or more portions of the stacked DRAM correspond to individual banks of the stacked DRAM.

20. A method comprising:

detecting, by one or more memory monitors, conditions of a stacked dynamic random-access memory (DRAM) in a package;

interfacing, by a controller in the package, with the stacked DRAM;

receiving, by a system manager in the package, the detected conditions of the stacked DRAM from the one or more memory monitors; and interfacing, by the system manager in the package, with one or more systems to dynamically adjust at least one of a voltage or a frequency for operating individual DRAM die of the stacked DRAM based on the detected conditions.

* * * * *